(12) United States Patent
Ham

(10) Patent No.: US 7,131,092 B2
(45) Date of Patent: Oct. 31, 2006

(54) CLOCK GATING CIRCUIT

(75) Inventor: Jung Hoon Ham, Arlington, TX (US)

(73) Assignee: VIA Technologies, Inc., Taipei (TW)

( * ) Notice: Subject to any disclaimer, the term of this patent is extended or adjusted under 35 U.S.C. 154(b) by 199 days.

(21) Appl. No.: 11/018,796

(22) Filed: Dec. 21, 2004

(65) Prior Publication Data

US 2006/0132185 A1 Jun. 22, 2006

(51) Int. Cl.
*G06F 17/50* (2006.01)

(52) U.S. Cl. .............................. 716/6; 716/10; 716/11

(58) Field of Classification Search ............... 716/6, 716/10, 11; 326/93
See application file for complete search history.

(56) References Cited

U.S. PATENT DOCUMENTS

| | | | | |
|---|---|---|---|---|
| 4,825,097 A | * | 4/1989 | Bazil et al. .................. | 327/204 |
| 5,546,035 A | * | 8/1996 | Okamoto ..................... | 327/208 |
| 5,784,384 A | * | 7/1998 | Maeno ........................ | 714/726 |
| 5,835,045 A | * | 11/1998 | Ogawa et al. .............. | 341/155 |
| 6,252,448 B1 | * | 6/2001 | Schober ....................... | 327/259 |
| 6,323,709 B1 | * | 11/2001 | Kulkarni et al. ........... | 327/195 |
| 6,333,656 B1 | * | 12/2001 | Schober ....................... | 327/202 |
| 6,374,393 B1 | * | 4/2002 | Hirairi ............................ | 716/8 |
| 6,496,050 B1 | * | 12/2002 | Lloyd .......................... | 327/407 |
| 6,753,714 B1 | * | 6/2004 | Gupta ......................... | 327/202 |
| 2005/0007152 A1 | * | 1/2005 | Dhong et al. ................. | 326/95 |
| 2006/0109040 A1 | * | 5/2006 | Clerc .......................... | 327/199 |
| 2006/0170479 A1 | * | 8/2006 | Hirata et al. ................ | 327/295 |

* cited by examiner

*Primary Examiner*—Paul Dinh
*Assistant Examiner*—Suchin Parihar
(74) *Attorney, Agent, or Firm*—Thomas, Kayden, Horstemeyer & Risley

(57) ABSTRACT

Clock gating circuits are disclosed in the present disclosure. Also disclosed herein are methods for designing clock gating circuits in the early stages of manufacturing. In one embodiment of a method for designing a clock gating circuit, the method comprises providing a schematic layout of a D-type flip-flop, wherein the flip-flop has a reset terminal and two latches. The method further comprises modifying the layout of the flip-flop to create a clock gating circuit.

8 Claims, 4 Drawing Sheets

CLOCK GATING CIRCUIT

TECHNICAL FIELD

The present disclosure relates to processors and, more particularly, to clock gating circuits for controlling clock activity in processors. The present disclosure also relates to methods for designing clock gating circuits.

BACKGROUND

A processor typically contains a timing component, such as a clock, for providing a reference clock signal that sets the timing of operations for the components of the processor. Each component operation can be clocked in such a way so as to provide synchronization with all the other components of the processor.

A significant portion of the total power consumption of a processor, however, is the power required to distribute the primary clock signal throughout the processor. Power consumption therefore becomes an issue that cannot be ignored, especially for hand-held electronic devices in which processors are powered by a battery. Since a processor's clock typically consumes a relatively large amount of battery power, it is well known to design electronic devices such that the clock can be temporarily shut off during extended periods of inactivity. Since a processor often operates on non-critical instructions, such as "loop to self" instructions, it is beneficial to design processors with a mechanism for shutting off the clock to avoid unnecessary processor usage and power consumption during these non-critical times.

To shut off the clock, processors may include logic circuitry to "gate" the system clock. A system clock is gated when the periodic pulse of the clock is routed through a "clock gating circuit" that is capable of outputting either the regular clock pulses or a constant value. Because the power required to provide a constant logic value throughout the processor is less than the power required to provide the periodic clock pulse, the power consumption of the processor can be reduced.

To characterize a clock gating circuit for reducing power consumption, processor designers are typically required to create custom clock gating circuits for particular processor applications. For example, a custom clock gating circuit may be used to gate the system clock leading to large modules such as registers files. The tasks involved in creating these custom circuits can be quite time consuming, and how to integrate these circuits into the processor is a concern that must also be addressed. Even with conventional design techniques, clock gating circuits often do not meet stringent design specifications.

FIG. 1 illustrates a conventional processing system 10 of an electronic device, such as a battery-operated hand-held device. The processing system 10 includes power management logic 12, a processor 14, memory 16, and input/output devices 18, each interconnected via an internal bus 20. The processor 14 includes a clock 22 for driving the electrical circuitry as is well known. The memory 16 may include a memory controller and other hardware and/or software elements. The input/output devices 18 may include keyboards, keypads, display screens, etc. Since one of ordinary skill in the art will understand the general operations and functions of the memory 16 and input/output devices 18, these components will not be further described in this disclosure.

The power management logic 12 may include hardware and/or software elements for determining specific circuit conditions that might be ideal times when automatic power-saving measures can be taken. For example, the power management logic 12 may monitor when the processor has not been working on any critical instructions for a predetermined length of time or it may monitor periods of user inactivity or other specific circuit conditions. In these situations, the power management logic 12 can request that the processor 14 disable its clock 22. Later, when a wake-up event occurs, the power management logic 12 can re-enable the clock 22.

FIG. 2 is a schematic diagram of a conventional clock gating circuit 24. The clock gating circuit 24 includes a D-type flip-flop 26 and an AND gate 28. The clock enable signal E is provided to the D input of the flip-flop 26 for enabling or disabling the clock signal CK, which is received from a clock source (not shown). The CK signal is supplied to the G input of the flip-flop 26 and to an input of the AND gate 28. The Q output from the flip-flop 26 is provided to the other input of the AND gate 28. When E and CK are both active, the AND gate supplies the effective clock signal ECK that is distributed to a clock-gated module (not shown). The clock-gated module may, for example, be a multi-port register file. When the power management logic 12 determines that the clock-gated module does not require a high power-consuming clock signal, then the clock gating circuit 24 can provide a constant low signal at the output ECK to save power.

However, the conventional clock gating circuit has several drawbacks. For instance, the E and CK signals will be in a race condition in which the first signal supplied to the respective input of the AND gate will have to wait until the other signal arrives. If the latched output Q comes later than CK, then the output ECK will be driven by the enable signal E and not by CK, which can result in a clock skew problem. To allow enough time to provide the Q output before CK, the setup time of E with respect to CK has to increase, thereby making the design process more complex. Also, this high setup time increases the delay of the circuit, thereby slowing the operation of the processor.

Another drawback is that the AND gate 28 is typically large in order to drive a number of loads. For this reason, the input capacitance of CK will become large as the size of the AND gate 28 is increased. To avoid the large input capacitance, buffers are needed either in front of the input CK or at the output ECK, thereby requiring more time to the custom design the circuit. Also, these buffers, added to the design of the clock gating circuit 24, will introduce a delay between the CK and the ECK terminals, which results in additional clock skew and may also result in an increase in the setup time for E.

Although a custom circuit can be designed and built around a clock gating cell to meet processor specifications, creating such a complex custom circuit is difficult to do and requires much time and effort to design, implement, characterize, and integrate. Thus, it would be desirable to provide an improved design and design strategy that would be less complex than that required for the conventional clock gating circuit 24. Also, a less complex circuit would allow designers to more quickly prepare the processor for market. In addition, it would be desirable to create a less complex circuit that also provides better timing specifications, minimizes the delay, maintains a high processing speed, and consumes a small amount of power.

SUMMARY

The present disclosure generally describes clock gating circuits. Also described herein are methods for designing the clock gating circuits. In one particular method for designing a clock gating circuit, for example, the method includes providing a schematic layout of a D-type flip-flop, wherein the flip-flop is configured having a reset terminal and two latches. The method further includes modifying the layout of the flip-flop to create the clock gating circuit.

By patterning the clock gating circuits after the general schematic layout of a common D-type flip-flop, the delay problems associated with the prior art can be avoided. Also, the tasks involved with implementing the clock gating circuit, as well as time for integrating the clock gating circuit into a processor, can be reduced with the presently described clock gating circuits and methods for designing the clock gating circuits. With the simple layout modifying techniques described herein, a processor with clock gating capabilities for reducing power can be designed and subsequently manufactured.

BRIEF DESCRIPTION OF THE DRAWINGS

Many aspects of the embodiments of the present disclosure can be better understood with reference to the following drawings. Like reference numerals designate corresponding parts throughout the several views.

DETAILED DESCRIPTION

The present disclosure is directed to an improved clock gating circuit, which addresses and overcomes the above-noted deficiencies of the prior art. Particularly, a clock gating circuit having a simplified design allows a circuit designer to more easily integrate the circuit into a processor. According to the teachings of the present disclosure, the design of the clock gating circuit is taken from the schematic layout of a D-type flip-flop as entered in an electronic design tool, such as Cadence Virtuoso™ or other suitable design tool. Then, by slightly modifying the standard flip-flop layout, a clock gating circuit can be created which provides several advantages over conventional clock gating circuits. For example, the delay in clock gating can be reduced while the processor operational speed is maintained at a high rate. The time and effort involved in designing a custom circuit will be reduced and simulation is greatly simplified. Design tasks are simpler and the time to implement this circuit into a processor can be reduced. Also, the setup time for the enable signal is reduced, as well as the delay from CK to ECK.

Figure 1:
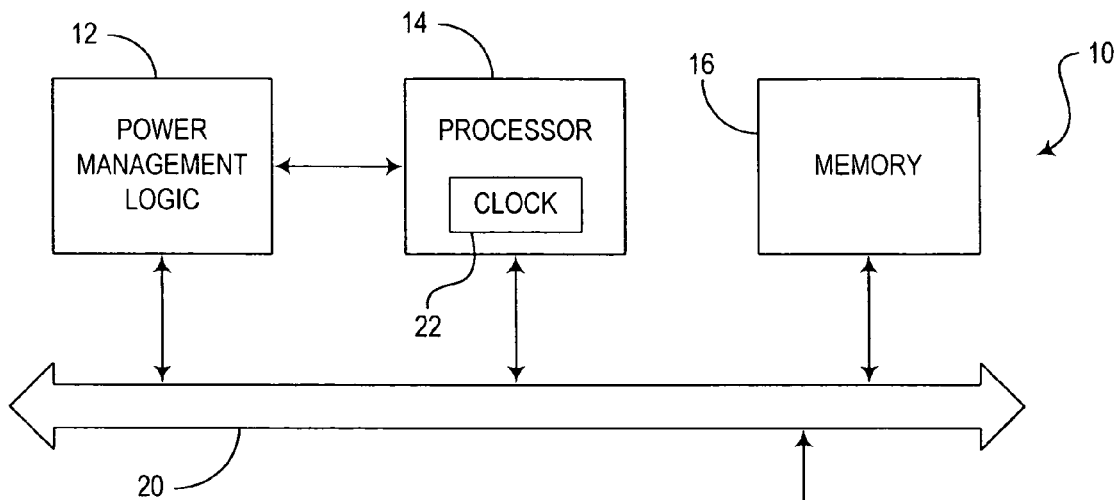
FIG. 1 is a schematic diagram of a conventional processing system.
Figure 2:
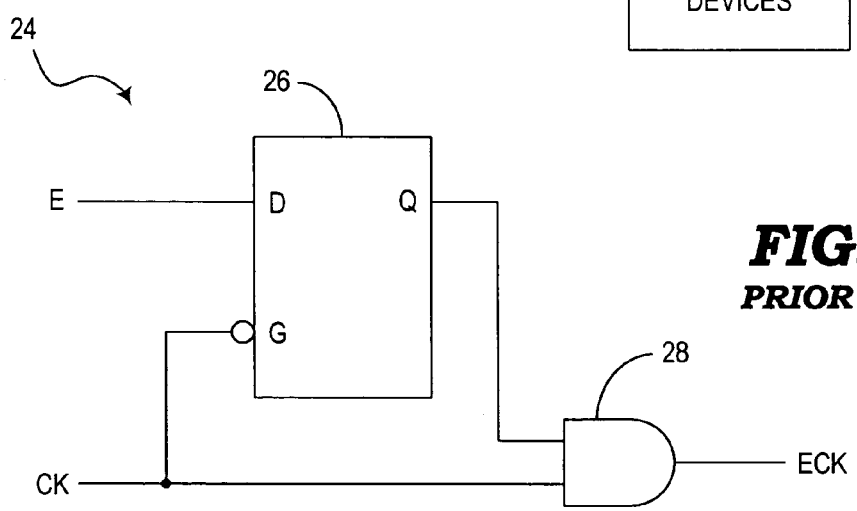
FIG. 2 is a schematic diagram of a conventional clock gating circuit.
Figure 3:
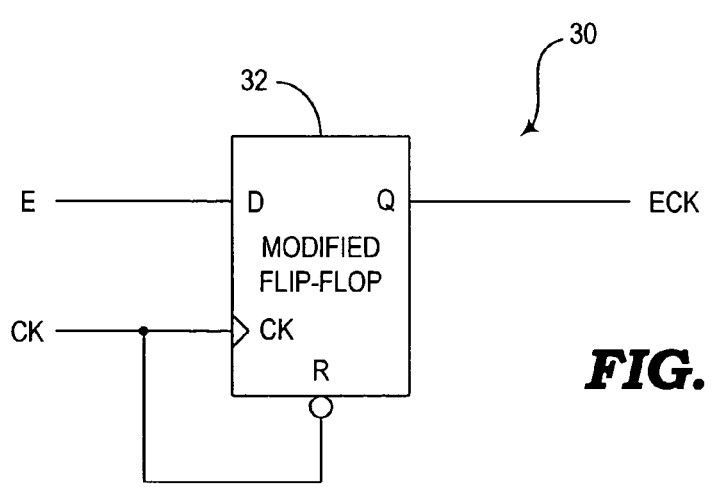
FIG. 3 is a schematic diagram of an embodiment of an improved clock gating circuit.

FIG. 3 is a schematic diagram of an embodiment of a clock gating circuit 30 according to the teachings of the present disclosure. The clock gating circuit 30 includes a modified flip-flop 32, and preferably a modified D-type flip-flop having a reset R terminal. It should be noted that reset is utilized in this embodiment as opposed to the typical operation of the conventional clock gating circuit 24. Although the schematic diagram illustrates the clock gating circuit 30 as a standard flip-flop 32, in actuality, the flip-flop 32 is modified as explained herein. Another characteristic to notice about the embodiment of FIG. 3 is that the AND gate 28 of the conventional clock gating circuit 24 is omitted. Also, since the Q output in this embodiment is the only output of consideration, the undesirable race condition of the prior art is avoided.

Figure 4:
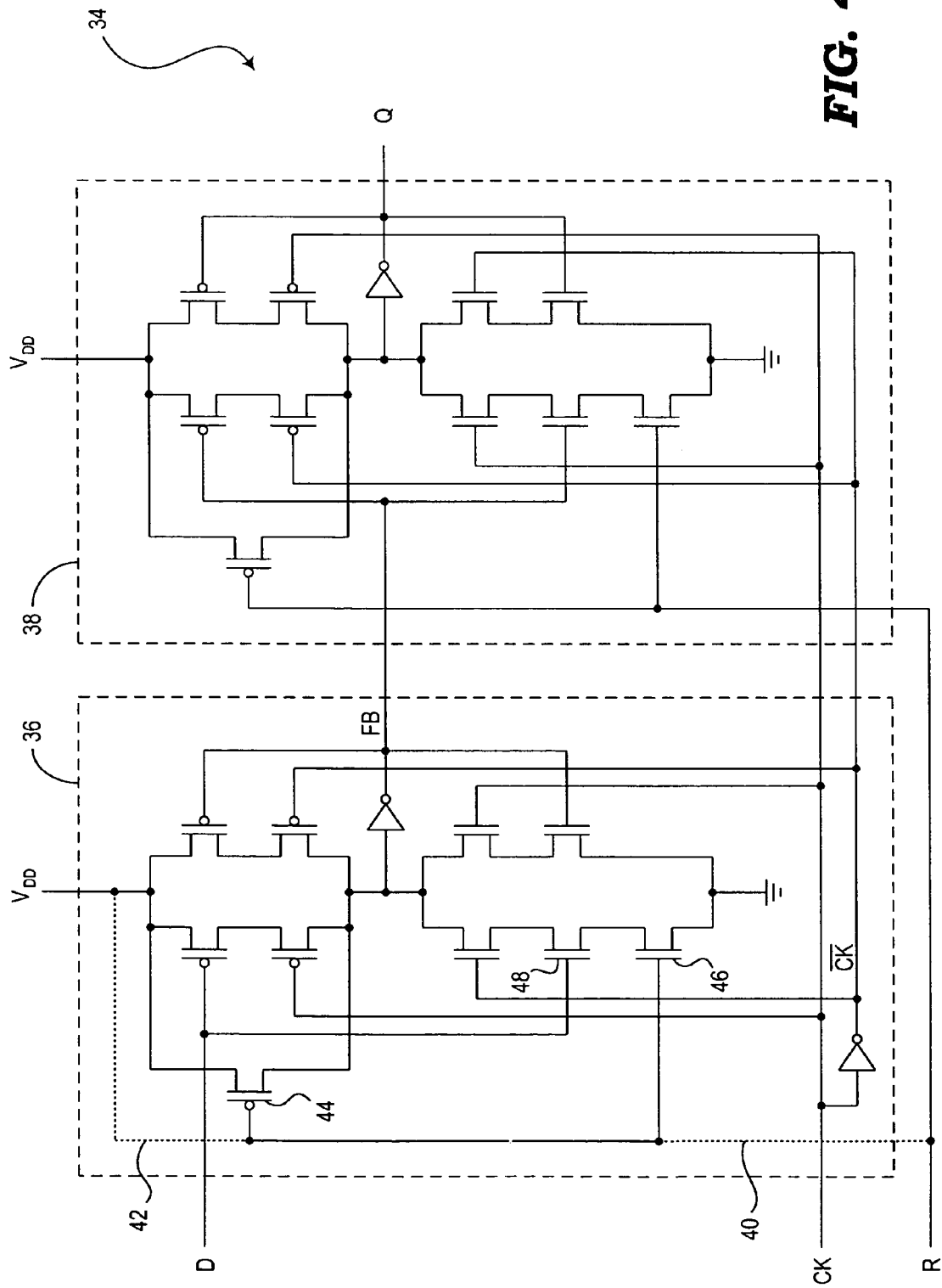
FIG. 4 is a schematic diagram of an embodiment of the internal circuitry of the clock gating circuit of FIG. 3.

FIG. 4 is a schematic diagram of an embodiment of the internal circuitry 34 of the clock gating circuit 30 of FIG. 3, modified with respect to the original flip-flop circuitry. To simplify the design tasks, a schematic layout of a typical D-type flip-flop is provided as a starting point for designing the clock gating circuit 30. In this embodiment, the D-type flip-flop includes a first latch 36 and a second latch 38. Also, the flip-flop includes a power $V_{DD}$ terminal, a data D terminal, a clock CK terminal, and a reset R terminal. The D, CK, and R terminals receive respective data, clock, and reset input signals.

Modifications can then be made to this general layout to convert the flip-flop into the circuitry 34 of the custom clock gating circuit 30. By utilizing an electronic design tool (e.g. Cadence Virtuoso™) and entering the internal design circuit of the flip-flop from a standard component library into the design tool, the backbone of the clock gating circuit is created. At this point, instead of adding buffer circuitry to the design to create the clock gating circuit, as is done in the prior art, the internal circuitry of the flip-flop is modified according to the following plan.

To create the circuitry 34 of the custom clock gating circuit, a line 40 connecting the reset R terminal to the first latch 36 of the flip-flop is removed or disconnected, but the reset R to the second latch 38 is left intact. This removal effectively separates the reset circuitry of the first latch 36 from the reset circuitry of the second latch 38. The reset circuitry of the first latch 36 includes, for example, a parallel-connected reset transistor 44 and a series-connected reset transistor 46. With the connection to the reset R terminal removed, the reset transistors 44 and 46 will no longer be responsive to a reset signal on the reset R terminal.

Another modification to the flip-flop layout to convert it to the clock gating circuit 30 includes adding a line 42 to connect the gates of the reset transistors 44 and 46 to $V_{DD}$. By tying these transistors high, the reset transistors 44 and 46 of the first latch 36 are essentially eliminated. For instance, with respect to transistor 44, a continuous high $V_{DD}$ signal at its gate causes the transistor 44 to act as an open circuit, making it virtually invisible in the first latch 36. For transistor 46, a continuous high signal from $V_{DD}$ causes the transistor 46 to act as a short circuit to connect the adjacent transistor 48 to ground.

As an alternative to the method described above, the designer may choose to remove the transistors 44 and 46 from the layout. In this case, the designer again starts with the schematic layout of the D-type flip-flop with first and second latches 36 and 38. Then, the transistors 44 and 46, and any related connections thereto, are removed. For transistor 44, this removal involves simply eliminating the transistor and connections from the layout. For transistor 46, removal of this component involves either removing the gate connection and converting the source and drain terminals of the transistor 46 to a common node or simply changing the source connection of the transistor 48 to ground. Changing the connection to a ground contact may preferably be done by completely bypassing the transistor 46 to connect the adjacent transistor 48 to ground. It should be kept in mind that removing the unused transistors will create more work to take them out of the layout and re-characterize the circuit. If the transistors are removed from the layout, the loading and timing of the signals, namely the setup, hold, pulse width, and delay from CK to Q, will also change accordingly, thereby requiring the circuit to be re-characterized.

Figure 5:
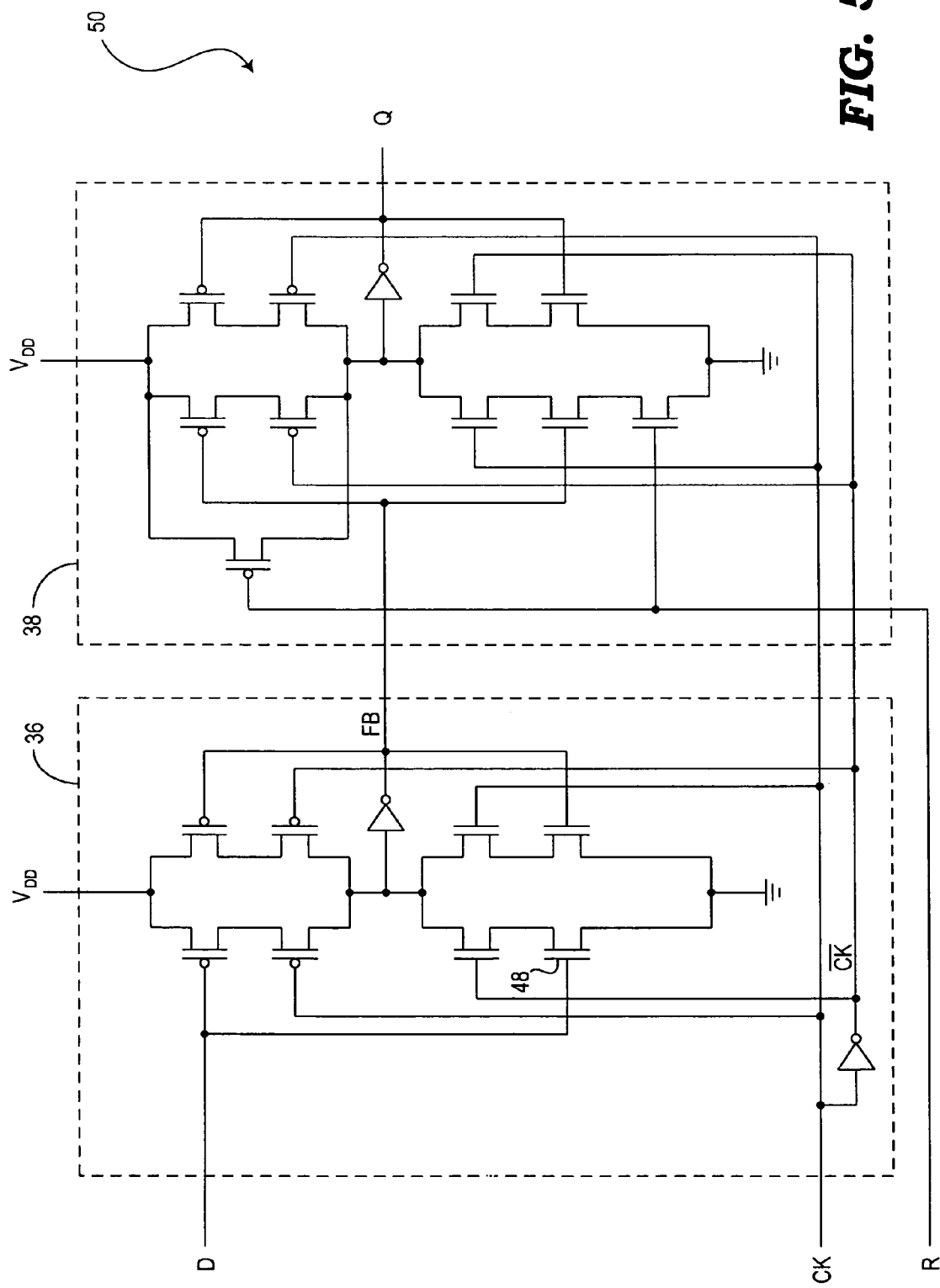
FIG. 5 is a schematic diagram of another embodiment of the internal circuitry of the clock gating circuit of FIG. 3.

FIG. 5 is a schematic diagram of another embodiment of internal circuitry 50 of a custom clock gating circuit. According to one technique for creating the internal circuitry 50 of the custom clock gating circuit, the circuitry 50 is laid out from scratch to include the resulting circuitry as illustrated. This technique is an alternative of the design technique described with respect to FIG. 4 and does not require alterations from the D-type flip-flop design. However, since the circuitry of a clock gating circuit can be easily modified from the circuitry of the common flip-flop, as explained with respect to FIG. 4, this alternative technique to create circuitry 50 from scratch might not be as easily implemented. It should be noted however that the timing results of each circuitry 34 and 50 meet the specifications within even the very strictest tolerances.

Figure 6:
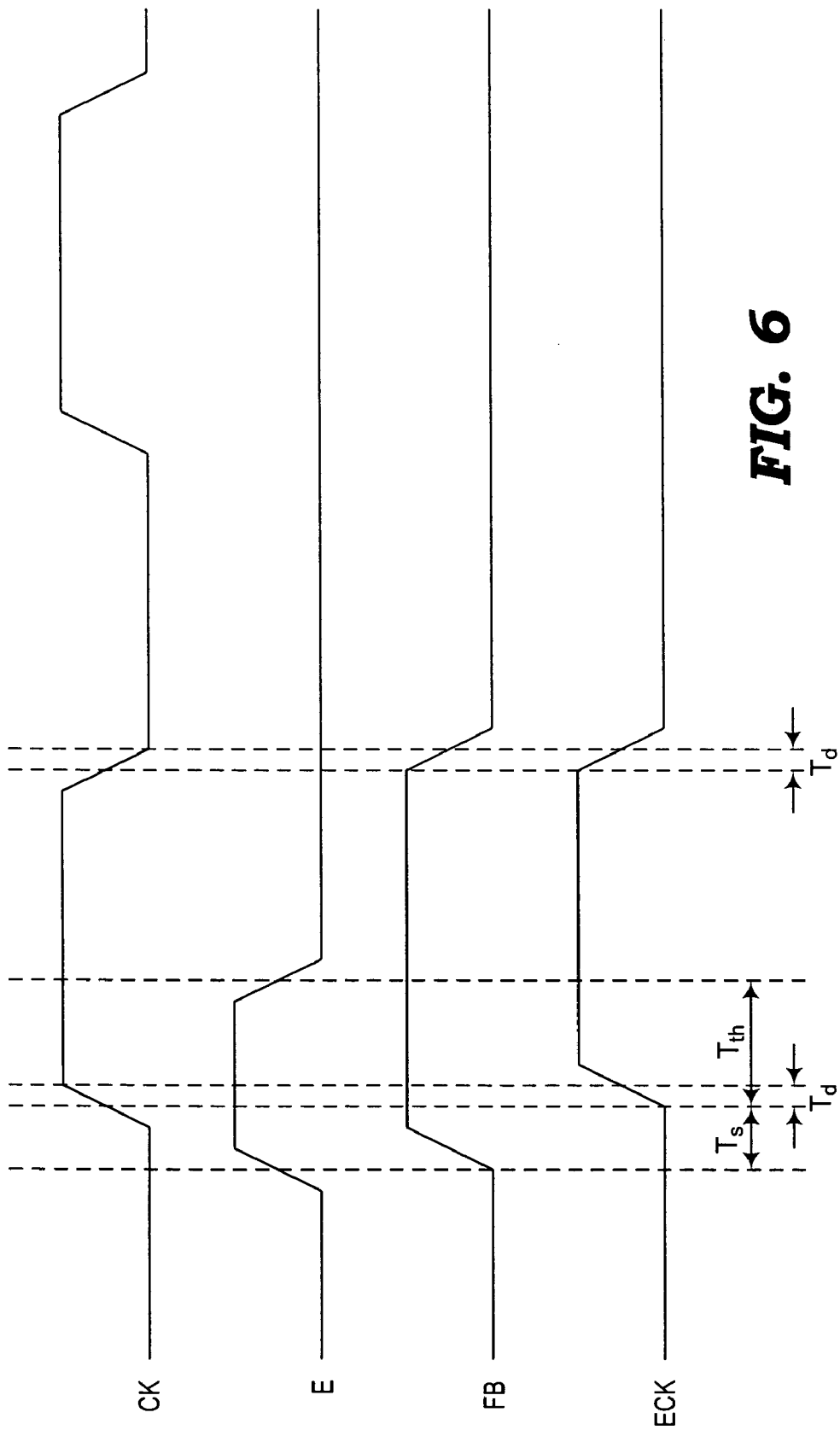
FIG. 6 is a timing diagram illustrating an example of the timing of signals propagating through the clock gating circuit of FIG. 3.

FIG. 6 is a timing diagram of the signals related to the clock gating circuits of FIGS. 4 and 5. In particular, it can be seen that the setup time $T_s$ from the rising edge of the enable E signal to the rising edge of the CK signal can be relatively short and predictable, thereby allowing the driving CK signal to have a sufficient threshold time $T_{th}$ to clock the circuit before E goes low. Also, with the reduced setup time $T_s$ of E, a larger window for the timing of the enable signal in other blocks of the system will exist. As long as the setup time of E is met, the transition of the output ECK will always follow the input clock CK signal with a short, fixed delay $T_d$. As an example, in TSMC 0.18u LP processors, the CK to ECK delay $T_d$ was reduced by a factor of at least three.

Since there are only latches in the circuit and no buffers, no more racing conditions exist. The clock gating circuits and techniques for designing them can be applied wherever a clock gating circuit is needed in a processor. Therefore, these circuits and related design methods can be configured as separate entities that can be designed into any type of processor.

As one of ordinary skill in the art will understand upon reading the present disclosure, since the physical properties of the clock gating circuit follow the standard flip-flop from which it is patterned, the timing data of the flip-flop can be used to simplify the design tasks. Also, the time and effort to characterize can be eliminated. Another advantage to the designer is that the troublesome clock-gated timing characteristics do not have to be taken into account since the custom circuit will have predictable timing data. Also, the time and effort to implement clock insertion techniques can be avoided.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A clock gating circuit having a modified schematic layout, the modified schematic layout being derived from the schematic layout of a D-type flip-flop having a first latch, a second latch, a $V_{DD}$ terminal, a data D terminal, a clock CK terminal, a reset R terminal, and an output Q terminal, the first latch comprising a first parallel-connected reset transistor and a first series-connected reset transistor, the second latch comprising a second parallel-connected reset transistor and a second series-connected reset transistor, the schematic layout of the D-type flip-flop being configured such that the reset R terminal is connected to the first parallel-connected reset transistor, first series-connected reset transistor, second parallel-connected reset transistor, and second series-connected reset transistor, wherein the modified schematic layout is derived from the schematic layout of the D-type flip-flop by removing the connection from the reset R terminal to the first parallel-connected reset transistor and first series-connected reset transistor and tying the first parallel-connected reset transistor and first series-connected reset transistor to the $V_{DD}$ terminal, wherein the modified schematic layout is effective to reduce a delay of a signal between the clock CK terminal and the output Q terminal.

2. The clock gating circuit of claim 1, wherein the clock gating circuit is configured to minimize clock skew problems.

3. The clock gating circuit of claim 2, wherein the clock gating circuit is configured to allow the output Q terminal to provide an output after a relatively small setup time for a data signal at the data D terminal.

4. The clock gating circuit of claim 1, wherein the clock gating circuit does not comprise a buffer circuit.

5. The clock gating circuit of claim 1, wherein the clock gating circuit has a relatively small input capacitance at the clock CK terminal.

6. The clock gating circuit of claim 1, wherein the delay of a signal between the clock CK terminal and the output Q terminal is minimized.

7. The clock gating circuit of claim 6, wherein the CK to Q delay is reduced by a factor of at least three.

8. The clock gating circuit of claim 1, wherein the clock gating circuit operates without the use of an AND gate.

* * * * *